(12) United States Patent
Li et al.

(10) Patent No.: US 7,550,358 B2
(45) Date of Patent: Jun. 23, 2009

(54) MEMS DEVICE INCLUDING A LATERALLY MOVABLE PORTION WITH PIEZO-RESISTIVE SENSING ELEMENTS AND ELECTROSTATIC ACTUATING ELEMENTS ON TRENCH SIDE WALLS, AND METHODS FOR PRODUCING THE SAME

(75) Inventors: Xinxin Li, Shanghai (CN); Heng Yang, Shangai (CN); Yuelin Wang, Shanghai (CN); Songlin Feng, Shanghai (CN)

(73) Assignee: Shanghai Institute of Microsystem and Information Technology, Chinese Academy of Sciences, Shanghai (CN)

( * ) Notice: Subject to any disclaimer, the term of this patent is extended or adjusted under 35 U.S.C. 154(b) by 177 days.

(21) Appl. No.: 11/811,572

(22) Filed: Jun. 11, 2007

(65) Prior Publication Data

US 2007/0259471 A1 Nov. 8, 2007

(51) Int. Cl.
*H01L 21/331* (2006.01)
(52) U.S. Cl. ............... 438/369; 438/181; 438/510; 438/542; 257/E21.056; 257/E21.238; 257/E21.466
(58) Field of Classification Search ................ 438/178, 438/181, 369, 423, 470, 513, 561, 924; 257/E21.056, 257/E21.057, E21.315, E21.466, E21.473
See application file for complete search history.

(56) References Cited

U.S. PATENT DOCUMENTS 6,743,654 B2 * 6/2004 Coffa et al. ................ 438/52

2003/0060051 A1 * 3/2003 Kretschmann et al. ...... 438/694

OTHER PUBLICATIONS

"SCREAM MicroElectroMechanical Systems ", by Noel C. MacDonald, Elsevier, Microelectronic Engineering 32 (1996) 49-73, 0167-9317/96.
"Trench oxide isolated Single crystal Silicon Micromachined Accelerometer", by Uppili Sridhar et al.,1998 IEEE, IEDM.475-478, 0-7803-4774-Sep. 1998.

(Continued)

*Primary Examiner*—Walter L Lindsay, Jr.
*Assistant Examiner*—Cheung Lee
(74) *Attorney, Agent, or Firm*—Saile Ackerman LLC; Stephen B. Ackerman; Rosemary L. S. Pike

(57) ABSTRACT

A method to create piezoresistive sensing elements and electrostatic actuator elements on trench sidewalls is disclosed. P-type doped regions are formed in the upper surface of an n-type substrate. A trench is formed in the substrate (e.g. by DRIE process) intersecting with the doped regions and defining a portion of the substrate which is movable in the plane of the substrate relative to the rest of the substrate. Then diffusion of P-type dopant into the trench side-walls creates piezoresistive elements and electrode elements for electrostatic actuation. Owing to the intersection of two doped regions, there are good electrical paths between the electrical elements on the trench side-walls and the previously P-type doped portions on the wafer surface. The trench intersects with insulating elements, so that insulating elements mutually insulate adjacent electrical elements. P-n junctions between the electrical elements and the substrate insulate the electrical elements from the substrate.

18 Claims, 7 Drawing Sheets

OTHER PUBLICATIONS

SOI (SIMOX) as a Substrate for Surface Micromachining of Single Crystalline Silicon Sensors and Actuators, by B. Diem et al., The 7th Int'l Conf. on Solid-State Sensors + Actuators, pp. 233-236.

"A New Isolation Method for Single Crystal Silicon MEMS and Its Application to Z-axis Microgyroscope", by Park et al., 2003—IEEE, IEDM 03-969-972, 0-7803-7872-May 2003.

"Silicon micromachined high-shock accelerometers with a curved-surface-application structure for over-range stop protection and free-mode-resonance depressiom", by Jian Dong et al., Inst-of Physics Pub., J. Micromech. Microeng. 12(2002) 742-746.

"A High-Performance Planar Piezoresistive Accelerometer", by Aaron Partridge et al., Jrnl. of Microelectromechanical Systems, vol. 9, No. 1, Mar. 2000.

"Bulk Micromachining of Silicon", by Gregory T.A. Kovacs, et al., Proceedings of the IEEE, vol. 86, No. 8, Aug. 1998, pp. 1536-1551.

"SCREAM I : A Single Mask, Single-Crystal Silicon Process for Microelectromechanical Structures", by Kevin A. Shaw et al., 1993, IEEE, pp. 155-160, 0-7803-0957-Feb. 1993.

"Surface/Bulk Micromachining (SBM) Process and Deep Trench Oxide Isolation Method for MEMS", by Sangwoo Lee et al., 1999 IEEE, IEDM 99-701 to 704, 0-7803-5410-Sep. 1999.

"Industrial MEMS on SOI", by Stéphane Renard, J. Micromech. Microeng. 10(2000) 245-249, Printed in U.K., 2000 Iop Pub. Ltd., 0960-1317/00/020245+05.

* cited by examiner though the oblique implantation process is performed an unlimited number of times.
MEMS DEVICE INCLUDING A LATERALLY MOVABLE PORTION WITH PIEZO-RESISTIVE SENSING ELEMENTS AND ELECTROSTATIC ACTUATING ELEMENTS ON TRENCH SIDE WALLS, AND METHODS FOR PRODUCING THE SAME

FIELD OF THE INVENTION

The present invention relates to the fabrication of MEMS devices, in particular MEMS devices including a laterally movable portion having one or more piezoresistive elements and/or electrostatic actuating elements on its sides.

BACKGROUND OF INVENTION

Since the advent of inductively coupled plasma (ICP) deep reactive etching (DRIE) technology, various MEMS (microelectromechanical systems) structures have been proposed comprising an element which is movable laterally in-plane, i.e. in the plane of the semiconductor substrate(s) from which the devices are typically produced. The laterally movable portion may take the form of a laterally deflectable cantilever. This kind of MEMS device benefits from advanced bulk-micro-machining fabrication capabilities of DRIE to form high aspect ratio micro-structures. In some applications of such MEMS devices, the motion of the movable portion is sensed (typically, by capacitive sensing); in other applications, the movable portion is moved by electrostatic actuation.

Unlike surface micro-machining fabrication, DRIE-based fabrication enjoys sticking-free release. In addition, in-plane lateral configuration can be exploited for other advanced features such as elimination of squeeze-film damping effects, comb-drive actuation and over-range self-caging, etc.

The fabrication technologies for in-plane lateral MEMS structures can be classified into two categories. The first category is SOI (silicon-on-insulator) wafer based technology [1, 2], in which a wafer includes a silicon layer formed over an insulating layer. The other category is based on the use of a single homogenous wafer such as crystalline silicon (such techniques are referred to here as "single-wafer-based"). Compared with SOI-wafer based technology, the single-wafer-based technique has advantages in terms of low-cost, simplification and integration compatibility with circuits, etc.

A single-wafer-based technology called "SCREAM" was developed for one-mask or two-mask processes [3, 4]. In this technology, a trench is formed by DRIE and lateral etching is performed by dry isotropic release at the trench bottom, to form lateral MEMS structures. Following this scheme, enhanced isolation capability was realised by chemical vapor deposition of insulating "bus-bars" at the trench bottom [5].

Instead of dry etching release methods, it is known to perform lateral wet release by anisotropic etching of a (111) silicon wafer for the formation of single-wafer-based in-plane lateral MEMS [6, 7]. These above mentioned technologies have been mainly used for capacitive sensors and electrostatic actuators.

Note that the MEMS devices described above have not made use of piezoresistive devices. Although piezoresistive devices have been widely adopted in MEMS devices having a conventional vertical configuration and which are fabricated using conventional anisotropic wet etching and sandwiched bonding, etc., piezoresistive sensing has seldom been employed for MEMS devices with a laterally movable portion. This is because there is no straightforward processing technology available for integration of both piezoresistive sensors and electrostatic actuators on the trench-sidewalls in MEMS devices with laterally movable portions. It is also a challenging task to form electric lead-out connections from the sidewalls to the wafer surface sufficiently precisely and ensure that piezoresistive sensing and electrostatic actuating elements on the trench sidewalls are electrically isolated from each other.

For these reasons, those few MEMS devices having laterally movable portions which use piezoresistive sensors usually locate the piezoresistors on the top surface of laterally movable portion [8]. In this configuration the piezoresistors do not sense the stress at the sidewalls of the movable portion, where stress may be maximal, thereby resulting in low piezoresistive sensitivity.

It is true that an oblique ion implantation method has been proposed for the integration of piezoresistors on the trench-sidewall of lateral MEMS structure [9], but this oblique implantation is not a standard process. It requires that the wafer is inclined at a certain angle in the processing equipment during the implantation. For a cantilever structure, the oblique implantation would have to be processed twice (in order that piezoresistors are formed on both sides of the cantilever). For a square shaped structure, the oblique implementation would have to be performed 4 times. For a circular MEMS structure, uniform sidewall doping cannot be obtained even if the oblique implantation process is performed an unlimited number of times.

One particular difficulty in providing MEMS devices with piezoresistive sensors and electrostatic actuators is the creation of paths for electrical transfer between the wafer surface (where circuitry is located) and the side walls of the movable portion or its surrounding frame, while simultaneously providing adequate electrical isolation between adjacent elements formed on the side walls.

SUMMARY OF THE INVENTION

The present invention aims to provide new and useful methods for producing MEMS devices, and in particular novel methods using a single homogenous wafer (i.e. single-wafer-based techniques) to produce MEMS devices comprising a portion which is movable laterally in-plane and having piezoresistive sensing elements and/or electrostatic actuator elements on trench sidewalls.

The invention further aims to provide new and useful MEMS devices produced using such methods.

The invention proposes in general terms that a doped region is formed in the upper surface of a substrate. A trench is formed in the substrate (e.g. by DRIE cutting) intersecting with the doped region and defining a portion of the substrate which is movable relatively to the rest of the substrate. Then diffusion of the dopant is effected into the trench walls, so that the some of the dopant moves onto the walls of the trench to create electrical elements (piezoresistor sensing elements and/or electrode elements for electrostatic actuation).

The electrical elements will still be in good electrical contact with the doped regions previously formed at the wafer surface, and thus there are good electrical paths between the electrical elements on the trench side-walls and respective portions of the surface of the substrate. This can be regarded as a "self-alignment" of the electrical elements and conductive doped regions of the substrate surface. The doped regions may in turn be connected to electrical lead-out paths formed of, say, aluminium.

Prior to the formation of the trench, electrically insulating elements are formed extending through the vertical depth of the laterally movable portion. The trench intersects with these insulating elements, so that the insulating elements mutually insulate adjacent ones of the electrical elements (i.e. pairs of electrical elements on the same trench side-wall and on respective sides of the insulating elements). Conveniently, the insulating elements may be formed from silicon dioxide $SiO_2$, e.g. produced by oxidising polysilicon deposited into apertures in the surface of the substrate.

The dopant is of a first conductivity type (e.g. a p-type dopant) and the substrate of a second conductivity type (e.g. an n-type dopant). For example, the dopant may be boron, and the substrate may be arsenic doped. This means that between the electrical elements and the substrates is a p-n junction, which implies that the electrical elements are insulated from the substrate.

Typically, the substrate is a homogenous single wafer, such as n-type silicon. Normally the substrate surface is (100) oriented with the piezoresistivity along <110> orientation. However, if the piezoresistor direction is designed along <100> orientation, n-type dopant may be used for the sidewall diffusion instead of p-type one. Accordingly, a p-type substrate would be used instead of an n-type one in this case. For consistent trench-sidewall doping, the same type dopant is normally used for both the piezoresistors and the electrostatic actuators at the same device.

Thus, the invention makes it possible for the first time to realise the formation of piezoresistive sensors and electrostatic actuators on the trench sidewalls of a MEMS device with a laterally movable portion formed from a homogenous single wafer. It is believed that this possibility will be highly valuable, particularly for 3-axis sensing with a self-calibration function, since such MEMS devices can be employed as advanced inertial sensors, resonators, etc.

In the simplest form, the movable portion may be an elongate cantilever which is arranged for motion in a single direction (e.g. in the plane of the wafer and transverse to a length direction of the cantilever). Alternatively, the movable portion may be formed to be capable of vibration in two transverse directions in the plane of the substrate. For example, the movable portion may be L-shaped or T-shaped and supported at one of its ends. In this case, the trench defining the movable portion extends in respective directions in different locations. The method of the invention can be used to form electrical elements in each of these locations. Thus, MEMS devices are fabricated which produce and/or measure motion in each of these two directions.

Furthermore, the principles of the invention can be applied in combination with existing techniques which produce piezoresistors and/or electrostatic actuators on the top surface of the wafer to produce MEMS devices in which the movable portion is movable in a direction transverse to the wafer surface. Optionally, the surface electrical elements can be produced before the electrical elements on the side walls of the trench.

Thus, the present method can be used to produce MEMS devices in which the movable portion is movable in 2- or 3-axes.

BRIEF DESCRIPTION OF THE FIGURES

Preferred features of the invention will now be described, for the sake of illustration only, with reference to the following figures in which.

DETAILED DESCRIPTION OF THE EMBODIMENTS

Figure 1:
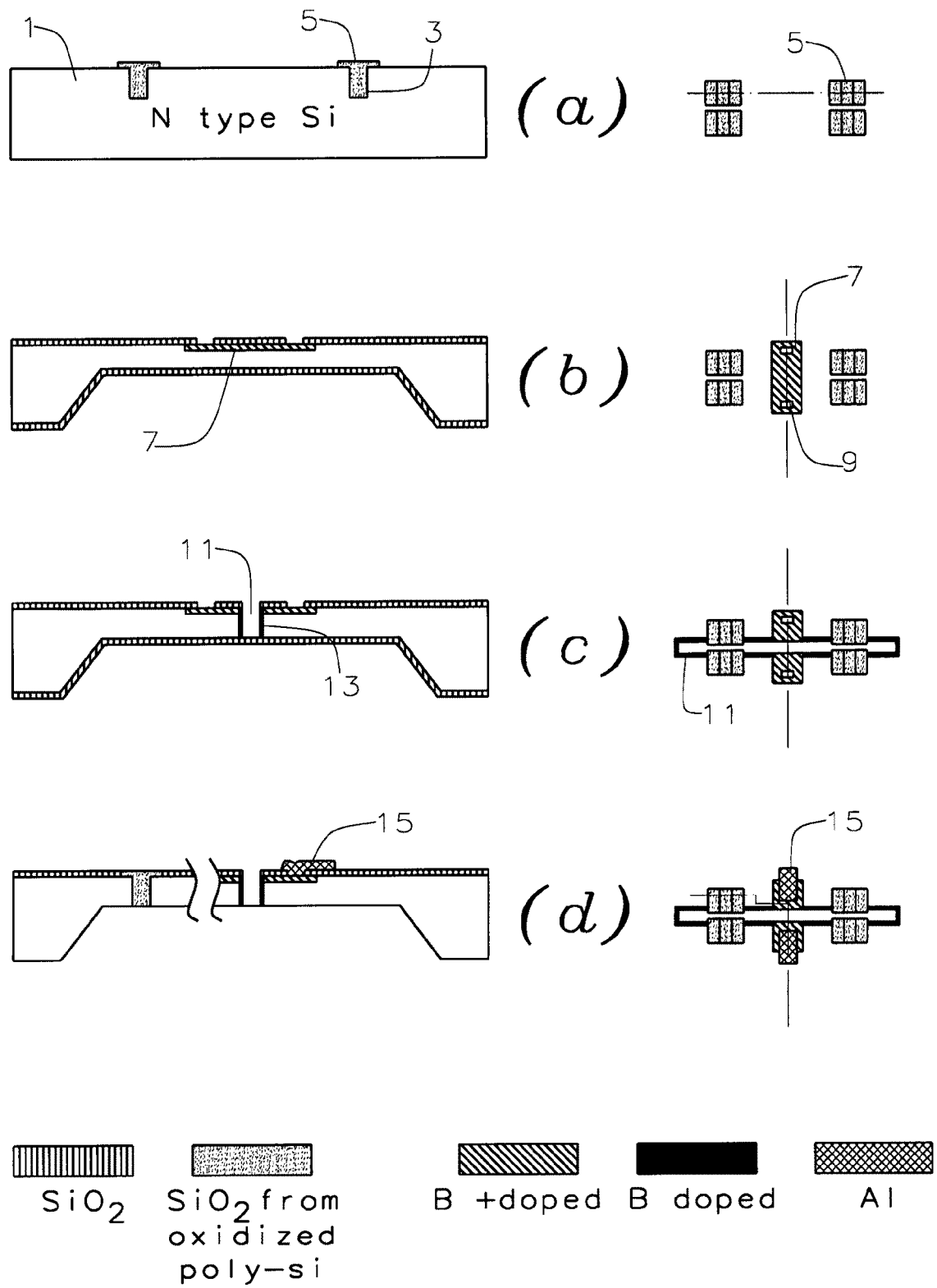
FIG. 1, which is composed of FIGS. 1(a) to 1(d), shows the steps of a technique proposed herein for forming electrical elements on the side walls of a trench in a MEMS.

Referring to FIG. 1, a process proposed here is described for creating a MEMS device having a trench and including electrical elements in the side walls of the trench. Subsequently, with reference to FIGS. 2 and 3 it is described how this technique can be used to produce a MEMS device which is an embodiment of the present invention, simply by producing a trench of a different shape which defines a laterally movable element.

FIG. 1 is composed of rows (a) to (d). In each row of the figure, the right part is a top view of a wafer and includes a dashed line. The left part of the row is a cross-sectional view along the corresponding line. The bottom part of FIG. 1 is a key indicating the meaning of the shading used in the figure.

The starting point of the method is a (100) n-type wafer 1. As shown in FIG. 1(a), short bar-shaped trenches 3 are formed in the wafer 1 using a DRIE process. The trenches 3 should be slightly deeper than the in-plane structure to be formed. The high aspect-ratio trenches 3 are partially refilled with LPCVD (low pressure chemical vapor deposition) polysilicon 5. Then, the poly silicon is thermally oxidized. By volume expansion of the oxidized poly silicon, the trenches are fully refilled and insulated by the $SiO_2$. This is the stage shown in FIG. 1(a).

Thermal oxidation is performed and then patterning is performed at the backside of the wafer (the bottom as shown in representations on the left of FIG. 1). Then, anisotropic wet etching is performed at the backside until the bottom of $SiO_2$-refilled trench 3 is exposed. Subsequently the wafer is oxidized and patterned at its top side, and p$^+$ is selectively doped in regions 7 (e.g. by ion implantation or pre-deposition) and then is driven into the top surface (e.g. by a high temperature process which causes an oxidation on the surface). Then contact holes 9 are opened through the oxide generated in the drive-in process, as shown in FIG. 1(b).

Using photo-resist as a mask, structural trenches 11 are DRIE formed in the MEMS structure. The $SiO_2$ layer at the backside provides the etching stop for the trench etching. The trenches 11 cut across the ends of the $SiO_2$-refilled trenches 3 and the p$^+$ patterns 7. The device is then placed in a boron rich atmosphere and, under high temperature conditions, boron diffuses into the sidewalls, to form piezoresistors and capacitive electrodes 13, as shown in FIG. 1(c). Since the trenches 11 cuts the ends of the $SiO_2$-refilled trenches and the p+ patterns, adjacent piezoresistors and capacitive electrodes 13 on the sidewall are electrically isolated by a combination of the insulated-trenches 5 and the boron-diffusion-formed p-n junctions along the sidewall. Electrical transfer from the sidewall to wafer surface is achieved via the intersection between the regions 7 and 13.

Subsequently, aluminium interconnects 15 are formed by deposition followed by a lift-off technique, and the SiO$_2$ layer at the backside is stripped by plasma etching to release the MEMS structure. The completed structure is shown in FIG. 1(*d*).

We now turn to a use of the method described above for the creation of a MEMS device which is the embodiment of the invention. The embodiment is shown in perspective view in FIG. 2, and is an integrated in-plane cantilever with piezoresistive sensing and capacitive actuating elements integrated on trench-sidewalls.

The embodiment is formed from a substrate 20 through which a trench 22 is formed to define a cantilever 21 surrounded by a frame 23. The upper surface of the substrate is thus partitioned into the upper surface of the cantilever 21 and the upper surface of the frame 23. The MEMS device is mirror symmetric about the length direction of the cantilever 21, but in FIG. 2 a nearside portion of the frame 23 is treated as transparent to explain the structure more clearly. The cantilever is free to vibrate in the direction marked in FIG. 2 as the "lateral moving direction", which is within the plane of the upper surface of the cantilever 21.

Some portions 25 of the upper surface of the substrate 20 have been doped with p+ dopant (i.e. boron). During the formation process (as described above) some of the doping atoms diffuse into the lateral surfaces of the cantilever 21 and of the cantilever base, where they produce a piezoresistor layer 27 for differential sensing. Furthermore, diffusion of the dopant into the trench walls of the frame 23 produces electrostatic actuating plates 29 on the inwardly facing lateral surfaces of the frame for actuation of the cantilever 21.

Before the formation of the trench 22, SiO$_2$ elements 28 were formed within the substrate extending transverse to the surface (and corresponding to the SiO$_2$ bodies 5 of FIG. 1). In the completed MEMS device of FIG. 2 the piezoresistor layer 27 intersects with some of these SiO$_2$ elements 28, and is thus divided into separate piezoresistor sensors 25. Similarly, the electrostatic actuation plates intersect with others of the SiO$_2$ elements 28 and are divided into individual actuation electrodes 29. Lateral deflection of the cantilever 21 can be electro-statically driven by the electrodes 29 and measured by the piezorestive sensors 27 on the side walls. This kind of structure with both sensing and actuating functions can be used straightforwardly in many MEMS applications such as inertial sensors and resonators, etc.

Figure 2:
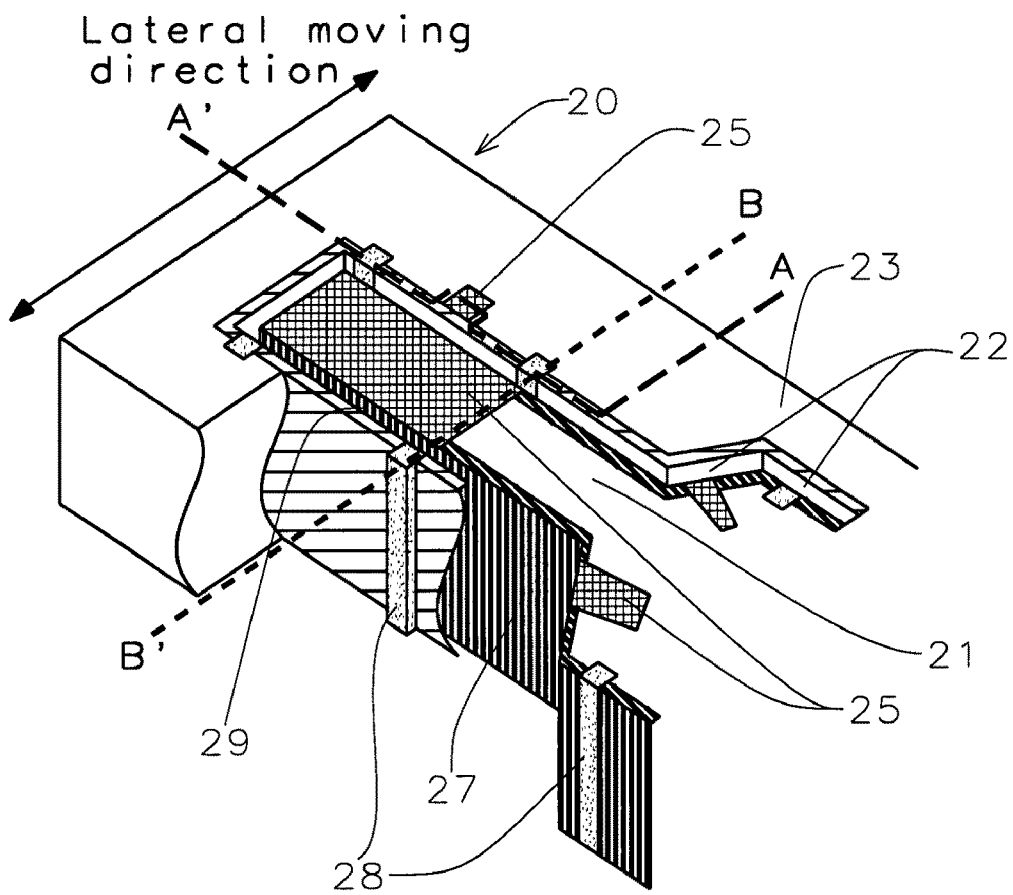
FIG. 2 is a perspective, partially cut-away view of a MEMS device which is an embodiment of the invention.

The process steps to produce the MEMS device of FIG. 2 are described as follows with reference to FIG. 3. Items present in both FIGS. 2 and 3 are labelled by the same reference numerals.

(1): The starting material for the fabrication process is a 4-inch (100) wafer with N-type substrate 20 doped at a level in the range 1 to 5 Ω·cm. First, deep trenches 30 perpendicular to the substrate are etched by induction coupled plasma (ICP) DRIE (with Alcatel 601E etching system). The etching depth is 50 μm-deep and 3.5 μm-wide. After DRIE, the by-product polymer compound generated during the DRIE is stripped by a cleaning sequence as follows: the wafer is wet cleaned with EKC265 solution at 70° C. for 30 minutes. Then an oxygen-plasma etch of 10 minutes is used for dry cleaning. After the wafer 20 is cleaned, a 300 nm-thick layer of silicon dioxide 31 is thermally grown on it. Then the trenches 30 are partly refilled with conformal poly-silicon 33 by LPCVD. The deposition is processed under 630° C. for the thickness of 850 nm.

Figure 3:
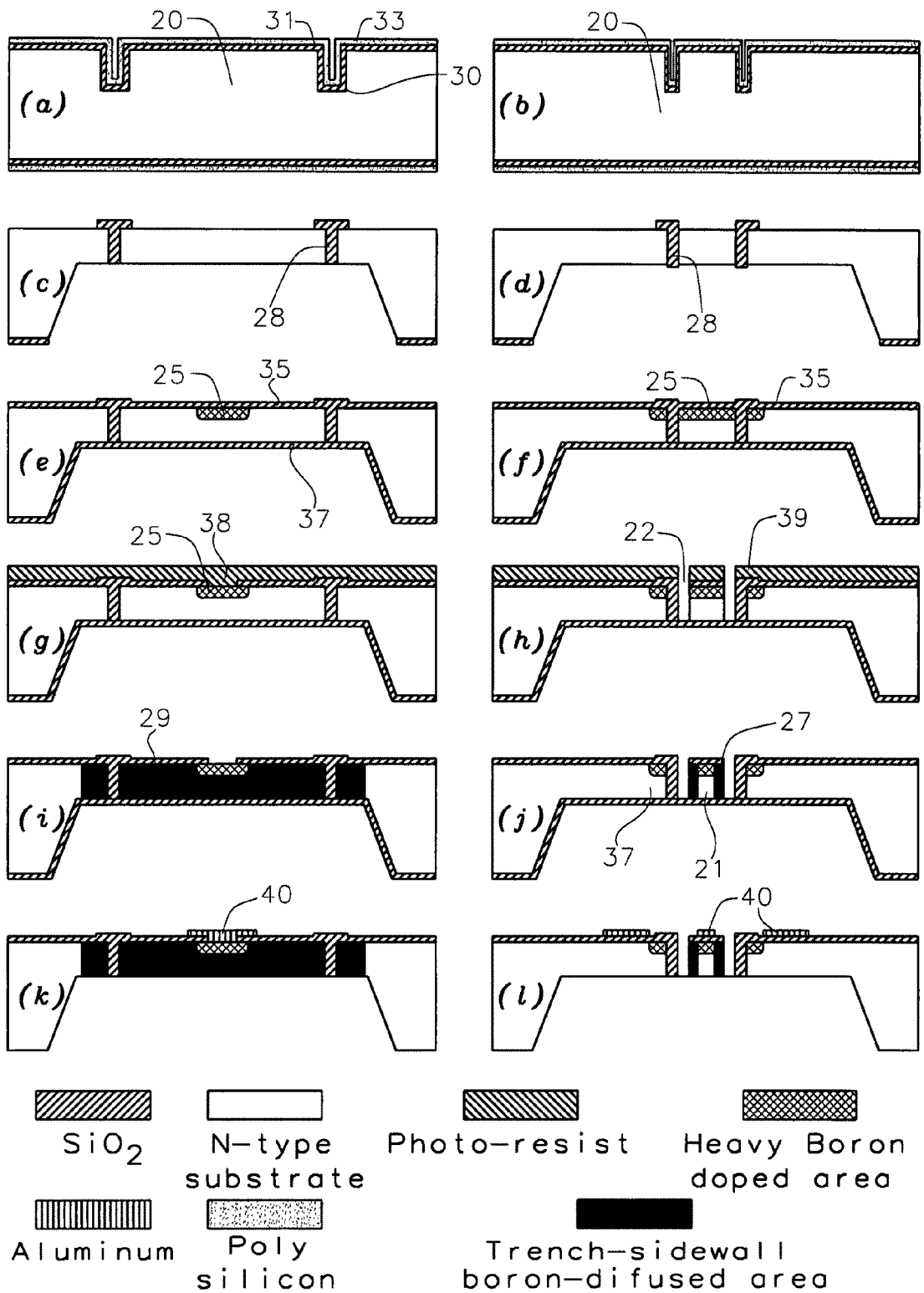
FIG. 3, which is composed of FIGS. 3(a) to 3(l), shows the process steps to produce the device of FIG. 2.

The structure at this time is shown in FIGS. 3(*a*) and 3(*b*), which show respectively cross-sections along the lines A-A' and B-B' in FIG. 2.

(2): The trenches 30 are fully refilled and SiO$_2$-insulated by volume expansion due to oxidization of the poly-silicon 33. To reduce thermal stress, the oxidation temperature is set as 950-1000° C. The insulated trench 30 is fully refilled without void throughout the trench cross-section to create SiO$_2$ bodies 28. During the poly silicon oxidation, a thick SiO$_2$ layer is also formed on both sides of the wafer. After patterning at the backside, TMAH anisotropical etching from the backside thins down the substrate under the cantilever regions until the bottom of the insulated trenches 30 is reached. For a 400 μm-thick wafer, the backside etching is about 350 μm in depth. The SiO$_2$ layer covering the front wafer surface can protect the front side from the backside etching. Then, the frontside SiO$_2$ is stripped by buffered HF except for the areas of the insulated trenches 30. The structure at this time is shown in FIGS. 3(*c*) and 3(*d*), which show respectively cross-sections along the lines A-A' and B-B' in FIG. 2.

(3): A 300 nm-thick SiO$_2$ layer is thermally grown on both sides of the wafer. After patterning at the front side, a region 25 of the front of the wafer is heavily doped with boron. As described above with reference to FIG. 2, the p$^+$ regions 25 provide electrical transference from the wafer surface to the sidewalls of the trenches produced later in the fabrication process. Either an implantation or a diffusion process can be used for this p$^+$ doping. During drive-in, a new layer of SiO$_2$ grows over the doping regions 25. The heavy doping level is set at a sheet resistance of about 20 Ωcm. During the heavy doping, the backside is protected by the existing SiO$_2$ layer 37. The structure at this time is shown in FIGS. 3(*e*) and 3(*f*), which show respectively cross-sections along the lines A-A' and B-B' in FIG. 2.

(4): Contact-holes 38 are opened in the SiO$_2$ layer for the latter aluminum interconnection. Then, 5.5 μm-wide trenches 22 are produced using an ICP process with photo-resist 39 as the mask. This produces the <110>-oriented cantilever 21. The trench etching is stopped automatically at the backside SiO$_2$-layer 37. These structural trenches 22 are cut across the surface p+ areas 25 with the p$^+$ cross-sections exposed at the sidewall-surface for later electric transference. The structural trenches 22 also cut cross the previously formed SiO$_2$-trenches 30. The oxide 28 filled in the insulated trenches 30 should be partially exposed outside of the trench-sidewalls so as to ensure electric isolation on the trench sidewall. The structure at this time is shown in FIGS. 3(*g*) and 3(*h*), which show respectively cross-sections along the lines A-A' and B-B' in FIG. 2.

(5): The surface cleaning process used in step (1) is used again for stripping the deposited compound residues generated in the ICP process. Boron diffusion for the trench sidewalls is performed by placing the device in a boron-rich atmosphere at a predetermined temperature. The wafer surface and backside are protected from diffusion by the existing SiO$_2$ layers 35, 37 with the exception of the contact holes 38. The diffusion at the contact holes 38 has little influence as the p$^+$ areas are already heavily doped. After boron diffusion on the sidewalls, both piezoresistors 27 and self-testing electrodes 29 are formed on the trench-sidewalls and electrically isolated by the combination of the SiO$_2$-insulation elements 28 as well as p-n junctions along the sidewalls formed by the boron-diffusion. The electric transference from trench sidewall to wafer surface is simultaneously completed via the overlaps between the sidewall diffusion regions 27, 29 and the surface p$^+$ doping regions 25. During the drive-in phase of the sidewall diffusion, nitrogen is first introduced and switched to oxygen at the last minutes in order to grow a thin SiO$_2$ layer on the sidewall for surface passivation and protection of the sidewall piezoresistors. The structure at this time is shown in FIGS. 3(i) and 3(j), which show respectively cross-sections along the lines A-A' and B-B' in FIG. 2.

(6): Reactive ion etching (RIE) is used to remove the thin oxide layer in the contact holes 38 while the relatively thick oxide layer at other areas remains. Then aluminum is sputtered onto the structure and patterned with a photoresist lift-off technique to provide interconnections 40. After aluminum sintering, the cantilever 21 is freed by RIE stripping the $SiO_2$ layer 37 from the backside of the wafer. The structure at this time is shown in FIGS. 3(k) and 3(l), which show respectively cross-sections along the lines A-A' and B-B' in FIG. 2.

Figure 4:
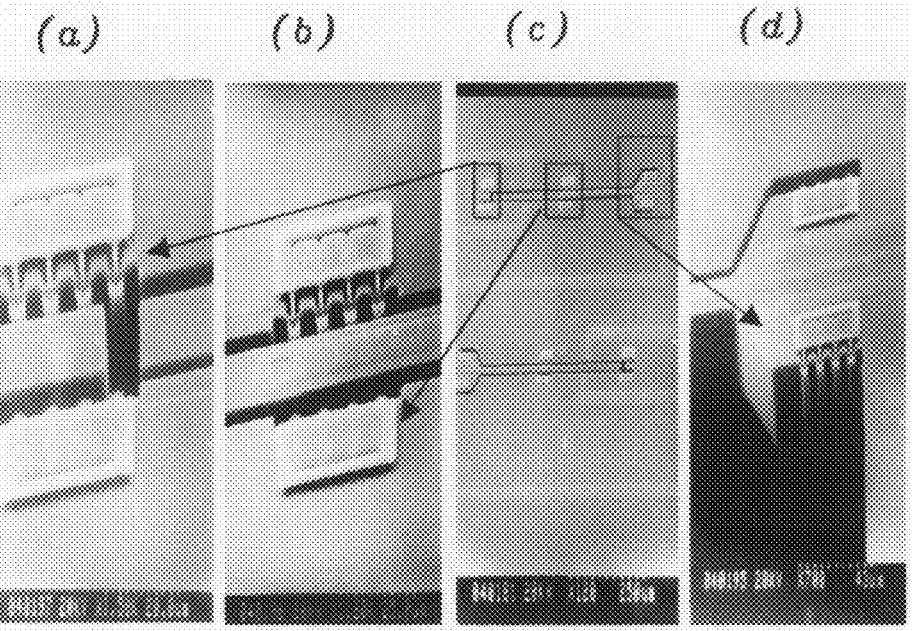
FIG. 4, which is composed of FIGS. 4(a) to 4(d), is four SEM views of actual devices of the kind shown in FIG. 2.

FIG. 4 shows SEM images of a device fabricated as described above. The lower resolution image FIG. 4(c) shows the overall cantilever structure. FIG. 4(d) shows the cantilever base area, and in particular two $SiO_2$ isolation bodies 28 near the base of the cantilever. FIG. 4(a) shows the tip of the cantilever, and FIG. 4(b) shows an intermediate region along the cantilever. Both views FIGS. 4(a) and 4(b) show further $SiO_2$ isolation bodies 28.

We now turn to experiments characterising the devices pictured in FIG. 4.

Figure 5:
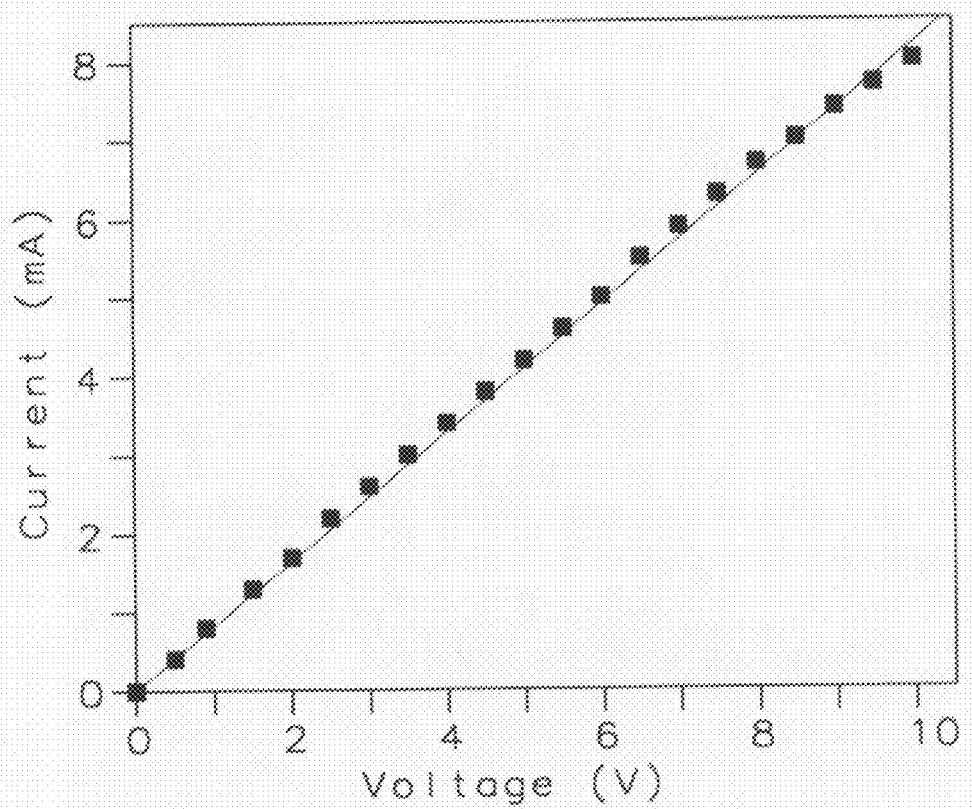
FIG. 5 is an I-V plot of the electrical properties of the piezoresistors of the devices of FIG. 4.
Figure 6:
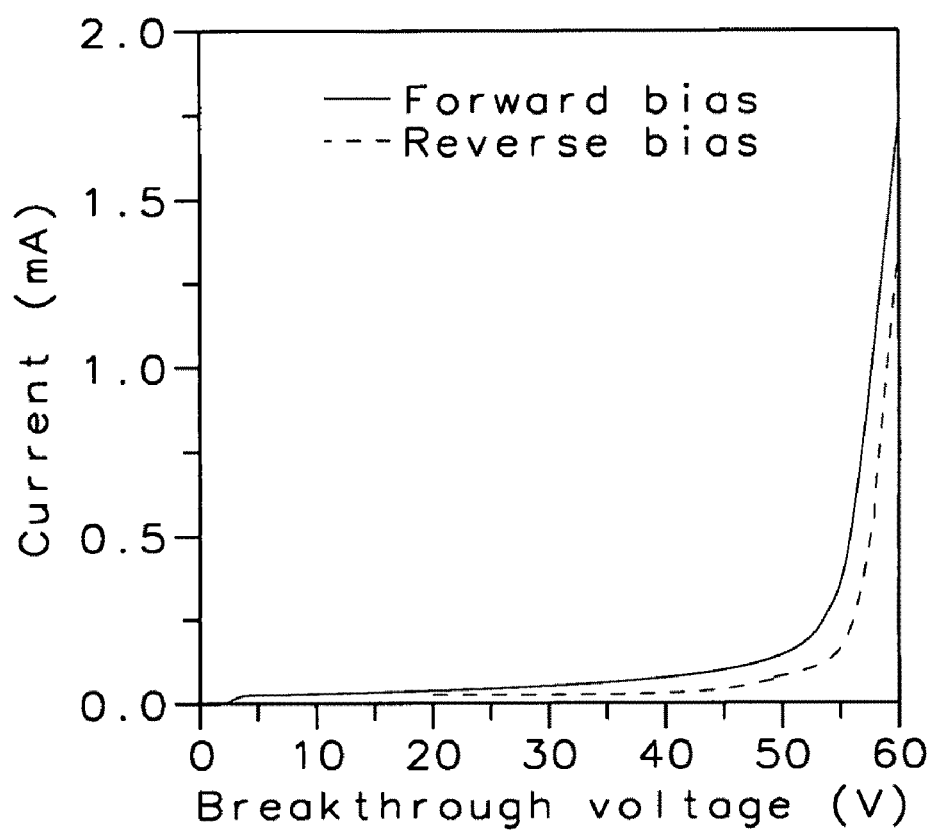
FIG. 6 is an I-V plot illustrating breakthrough properties (including breakthrough voltage) between two mutually isolated actuating electrodes of the devices of FIG. 4.

Firstly, the electrical characteristics of the fabricated devices are evaluated. A negative electrical potential is supplied to the aluminium contacts of the piezo-resistive elements 27 relative to the substrate. As shown in FIG. 5, the measured linear I-V property of the sidewall piezoresistor elements 27 indicates ohmic contact of the sidewall-to-surface electric transference. The sheet resistivity is about 200Ω.

The electrical isolation provided by the $SiO_2$-refilled trenches and the sidewall-diffused p-n junction is also evaluated. A potential difference is applied to two adjacent electrodes 29, and the current between them is measured. The result is plotted on FIG. 5, which shows that the breakdown voltage is higher than 50V. Such an electrical isolation is good enough for most MEMS operations.

Figure 7:
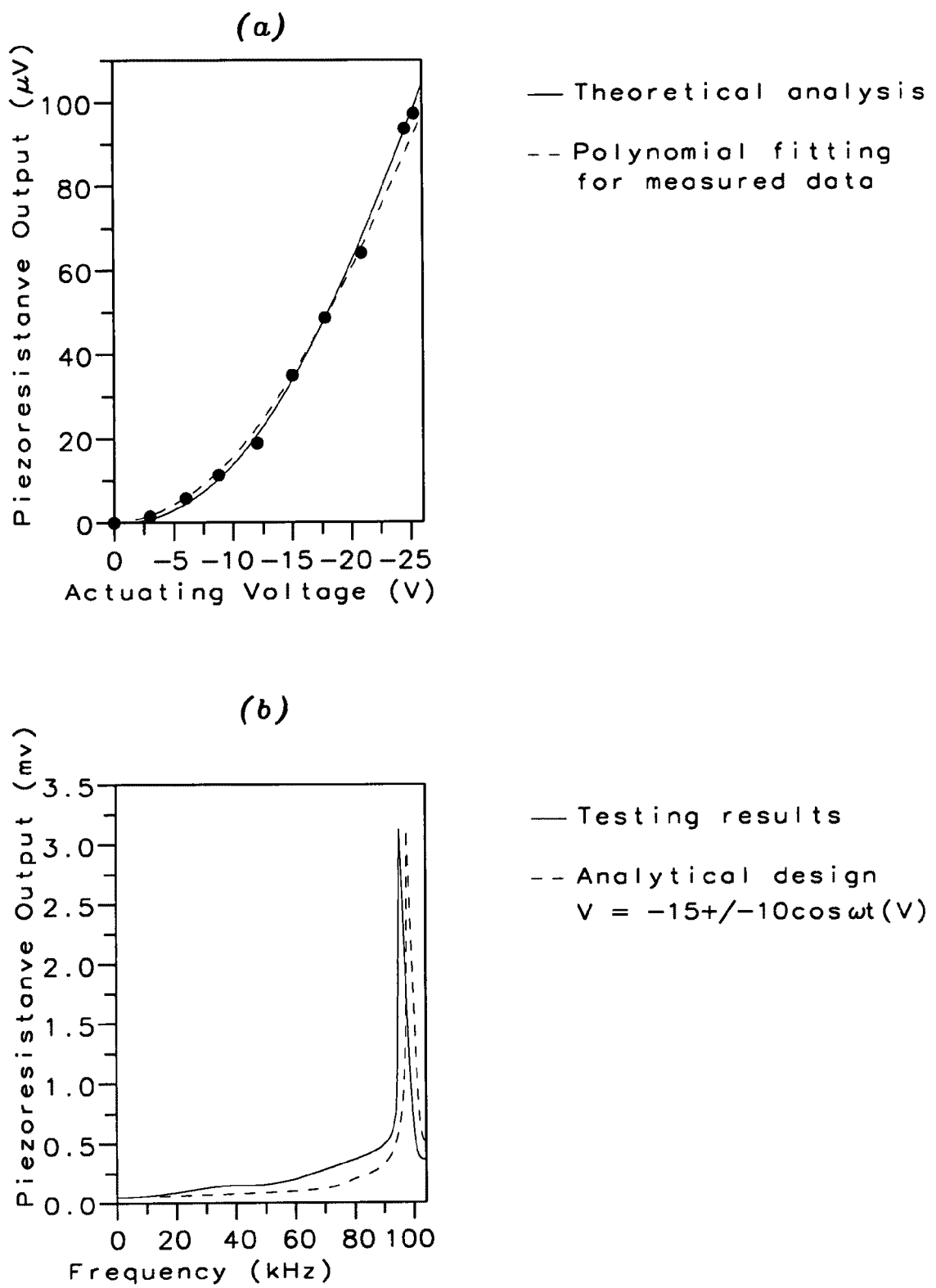
FIG. 7, which is composed of FIGS. 7(a) and 7(b), shows the piezoresistive output of the devices of FIG. 4 as a function of the actuating voltage and of its frequency respectively.

Additionally, the electromechanical performance of the fabricated cantilever is characterized. Firstly, a static measurement is performed in which a DC voltage is applied to electrostatically actuate the cantilever beam 21 and the piezoresistive response of the piezoresistors 27 is recorded and plotted in FIG. 7(a). As shown in FIG. 7(a), the measured piezoresistive output rises in proportion to the square of the actuating voltage, which agrees well with analytical predictions. Secondly, a dynamic test is performed, in which a differential AC voltage signal of 15±10 cos ωt (V) is applied to the electrodes 29, and thus used to drive the cantilever beam. The measured piezoresistive response is plotted in FIG. 7(b), and shows a 3.2 mV peak output at a resonant frequency of 96.6 kHz. These results also match well with analytical predictions (shown in the dotted line).

Figure 8:
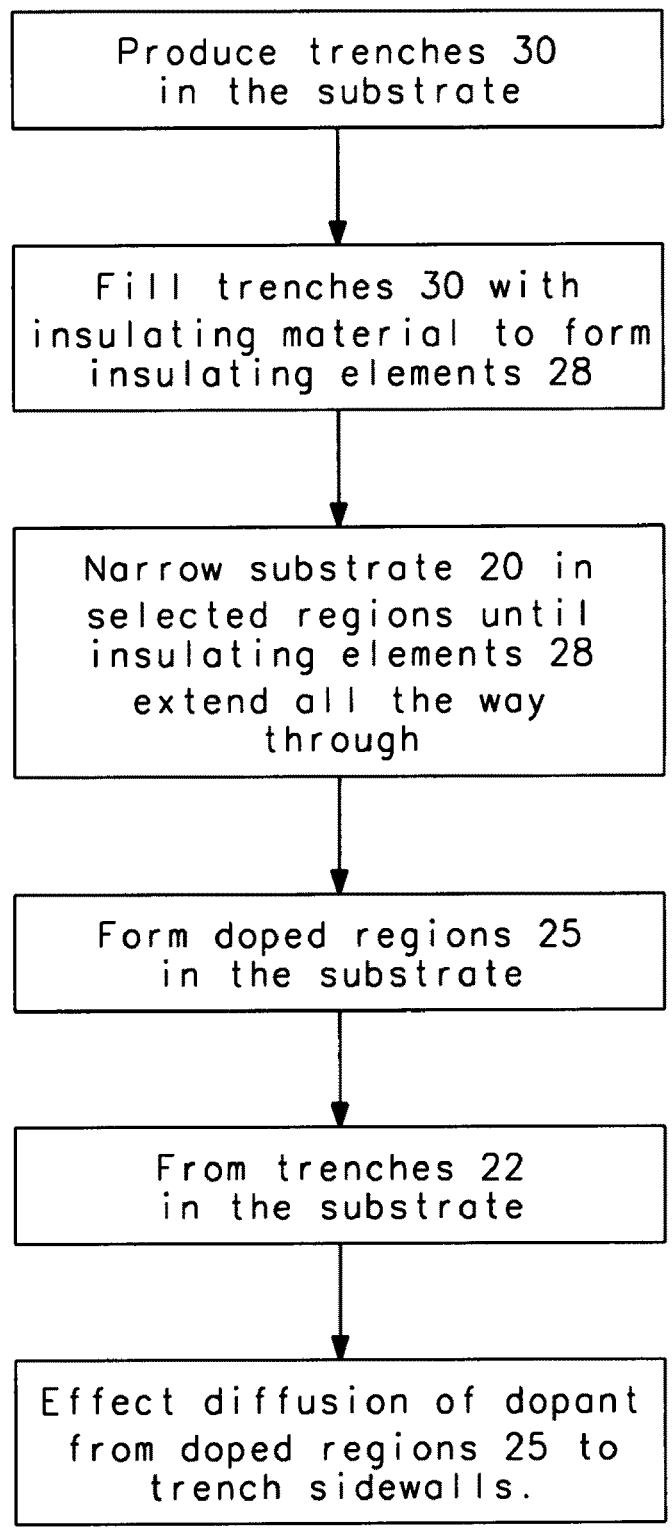
FIG. 8 is a flow diagram of the main processing steps of the embodiment of FIG. 3.

The main method steps of the embodiment discussed above in relation to FIG. 3 are summarized in the flow diagram of FIG. 8.

Note that the embodiments described above employ both piezoresistive sensor elements and actuator elements. However, the invention is not limited in this respect, and alternative useful devices may be formed in which only one of these two types of elements is formed. An advantage of using both is that it makes possible a self-calibration in which the sensor elements detect a motion caused by the actuator elements, so that the properties of the device can be measured.

Although only a single embodiment of the invention has been illustrated in detail, many variations are possible within the scope of the invention, as will be clear to a skilled reader. For example, whereas the cantilever 21 of FIG. 2 is arranged for motion in a single direction, in other embodiments the movable portion of the device may be arranged for motion in 2 directions in the plane of the substrate (e.g. by an appropriate shaping of the trench 22, and provision of the piezoresistors and actuating electrodes at locations along the trench which respectively sense and produce these two motions) and/or for motion also in a direction out of the plane of the substrate (e.g. using motion sensors and/or actuating elements on the surface of the substrate). In this case, the cantilever may be formed with a more complex configuration, e.g. comprising a comb, beam and/or plate.

Devices in which the movable portion can be moved in 2 or 3 directions are useful, for example, for multi-axis sensing applications. The design of movable portions which are capable of such motion are known in the literature, and these designs may readily be combined with the techniques disclosed herein for formation of the sensor elements and actuator elements.

REFERENCES

[1] G. Kovacs, N. Maluf, K. E. Petersen, "Bulk micromachining of silicon," *Proceedings of the IEEE*, vol. 86, no. 8, pp. 1536-1551, 1998.

[2] B. Diem, M. T. Delaye, F. Michel, S. Renard, and G. Delapoerre, "SOI (SIMOX) as a substrate for surface micromachining of single crystalline silicon sensors and actuators," in *Tech. Dig. Transducers '93*, Yokohama, Japan, 1993, pp. 233-236.

[3] K. A. Shaw, Z. L. Zhang, and N. C. MacDonald, "SCREAM I: A single mask, single-crystal silicon, reactive ion etching process for microelectromechanical structures," *Sens. Actuators A*, 40, pp. 63-70, 1994.

[4] N. C. MacDonald, "SCREAM microelectromechanical systems," *Microelectronic Engineering*, 32, pp. 49-73, 1996.

[5] U. Sridhar, H. Lau, L. Liu, "Trench oxide isolated single crystal silicon micromachined accelerometer," in *Tech. Dig. IEEE IEDM*-1998, San Francisco, Calif., 1998, pp. 475-478.

[6] S. Lee, S. Park, Dong-il Cho, Y. Oh, "Surface/bulk micromachining (SBM) process and deep trench oxide isolation method for MEMS," *Tech. Dig. IEEE IEDM*-1999, Washington D.C., 1999, p. 701-704.

[7] S. Park, J. Kim, D. Kwak, H. Ko, W. Carr, J. Buss, Dong-il Cho, "A new isolation method for single crystal silicon MEMS and its application to Z-axis microgyroscope," *Tech. Dig. IEEE IEDM*-2003, Washington D.C., 2003, p. 969-972.

[8] J. Dong, X. Li, Y. Wang, D. Lu, and S. Ahat, "Silicon micromachined high-shock accelerometers with a curved-surface-application structure for over-range stop protection and free-mode-resonance depression," *J. Micromech. Microeng.*, vol. 12, pp. 742-746, 2002.

[9] A. Partridge, J. Reynolds, B. W. Chui, E. Chow, A. Fitzgerald, L. Zhang, N. Maluf, T. Kenny, "A High-Performance Planar Piezoresistive Accelerometer,"*J. Microelectromech. Syst.*, vol. 9, pp. 58-66, 2000.

The invention claimed is:

1. A process for forming a MEMS device including a portion movable laterally in the plane of the device, the method including the steps of:
   forming electrically insulating elements extending through a substrate of a first conductivity type;
   doping regions of the surface of said substrate with a dopant of a second conductivity type opposite to said first conductivity type, to form doped regions of the surface of said substrate;

forming at least one trench in said substrate intersecting with said electrically insulating elements and said doped regions and defining said movable portion of said substrate which is arranged for movement in the plane of the surface of said substrate, said electrically insulating elements extending through the thickness of said laterally movable portion; and effecting diffusion of dopant of said second conductivity type into side walls of said at least one trench to form one or more piezo-resistive sensing elements for detecting motion of said movable portion of said substrate and/or one or more electrostatic actuator elements for moving said movable portion of said substrate, whereby electric contact is achieved between said doped regions on said trench side walls and said doped regions on the surface by intersection of said doped regions on said trench side walls with said doped regions on the surface.

2. The method according to claim 1 wherein said at least one trench is formed by DRIE cutting.

3. The method according to claim 1 wherein said substrate is a homogenous single wafer.

4. The method according to claim 1 wherein said insulating elements are formed by producing one or more apertures in said substrate and filling said apertures with insulating material.

5. The method according to claim 4 wherein, at the time said apertures are formed, said apertures do not extend through the entire thickness of said substrate, and in which, following the formation of said insulating elements, said substrate is reduced in thickness proximate said insulating elements until said insulating elements are exposed at the thin-downed portion of said substrate.

6. The method according to claim 4 wherein said apertures in said substrate are filled with insulating material by the steps of depositing polysilicon into said one or more apertures and oxidising said polysilicon.

7. The method according to claim 1 wherein, following said forming of said at least one trench, said insulating elements protrude into said at least one trench from the side walls of said at least one trench.

8. The method according to claim 1 wherein said movable portion is a cantilever movable in a single direction in the plane of said substrate.

9. The method according to claim 1 wherein said movable portion is moveable in multiple axis directions.

10. The method according to claim 1 further comprising forming one or more piezoresistor elements in the surface of said wafer.

11. A MEMS device including a portion movable laterally in the plane of said device, comprising:
  electrically insulating elements extending through a substrate of a first conductivity type;
  doped regions of the surface of said substrate having a second conductivity type opposite to said first conductivity type;
  at least one trench in said substrate intersecting with said electrically insulating elements and said doped regions and defining said movable portion of said substrate which is arranged for movement in the plane of the surface of said substrate, said electrically insulating elements extending through the thickness of said laterally movable portion; and
  one or more piezo-resistive sensing elements for detecting motion of said movable portion of said substrate and/or one or more electrostatic actuator elements for moving said movable portion of said substrate on side walls of said at least one trench, wherein electric contact is achieved between said doped regions on said trench side walls and said doped regions on the surface by intersection of said doped regions on said trench side walls with said doped regions on the surface.

12. The device according to claim 11 wherein said substrate is a homogenous single wafer.

13. The device according to claim 11 wherein said movable portion is a cantilever movable in a single direction in the plane of said substrate and transverse to the length direction of the cantilever.

14. The method according to claim 11 wherein said movable portion is moveable in multiple axis directions.

15. A MEMS device comprising:
  a substrate of a first conductivity type, said substrate including at least one trench extending through said substrate, intersecting with one or more insulating elements, and defining a portion of said substrate which is movable laterally in the plane of said substrate and a frame surrounding said substrate;
  said one or more insulating elements extending though the whole thickness of said movable portion of said substrate;
  the surface of said substrate including one or more regions doped with a dopant to have a second conductivity type opposite to said first conductivity type; and
  the side-walls of said at least one trench including one or more piezoresistive sensing elements and/or one or more electrostatic actuator elements formed by diffusion of dopant of said second conductivity type into said side walls of said at least one trench, said piezoresistive sensing elements and/or electrostatic actuator elements being mutually electrically isolated by said insulating elements and electrically connected to corresponding ones of said doped regions on the surface of said substrate.

16. The MEMS device according to claim 15 wherein said movable portion is an elongate cantilever arranged for motion in a single direction in the plane of said substrate and transverse to the length direction of the cantilever.

17. The MEMS device according to claim 15 wherein said movable portion is arranged for in-plane and out-plane motions with respect to said substrate.

18. The MEMS device according to claim 15 further comprising one or more sensing elements on the surface of said substrate.

* * * * *